(12) United States Patent
Eskridge et al.

(10) Patent No.: US 9,187,313 B2
(45) Date of Patent: Nov. 17, 2015

(54) ANODICALLY BONDED STRAIN ISOLATOR

(75) Inventors: Mark Eskridge, Renton, WA (US); Shifang Zhou, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 245 days.

(21) Appl. No.: 13/533,356

(22) Filed: Jun. 26, 2012

(65) Prior Publication Data

US 2013/0341735 A1 Dec. 26, 2013

(51) Int. Cl.
*H01L 29/84* (2006.01)
*B81B 7/00* (2006.01)

(52) U.S. Cl.
CPC .................... *B81B 7/0051* (2013.01)

(58) Field of Classification Search
CPC .... B81B 7/0048; B81B 7/008; B81B 3/0018; B81B 7/007; B81C 1/00246; H04R 19/005
USPC ...................... 257/418, 774, 417, 416, E21.5, 257/E21.499, E29.324
See application file for complete search history.

(56) References Cited

U.S. PATENT DOCUMENTS

2009/0261691 A1* 10/2009 Maeda .......................... 310/348

FOREIGN PATENT DOCUMENTS

EP 2246292 A2 11/2010

OTHER PUBLICATIONS

Search Report from counterpart European Patent Application No. 131719379, dated Jan. 2, 2014, 3 pp.
Examination Report from counterpart European Patent Application No. 13171937.9, dated Mar. 11, 2014, 4 pp.
Extended Search Report from counterpart European Application No. 15163575.2, dated May 29, 2015, 7 pp.

* cited by examiner

*Primary Examiner* — Kenneth Parker
*Assistant Examiner* — Bo Fan
(74) *Attorney, Agent, or Firm* — Shumaker & Sieffert, P.A.

(57) ABSTRACT

A stress isolator that allows a sensor to be attached to materials of the same coefficient of thermal expansion and still provide the required elastic isolation between the sensor and the system to which it is mounted. The isolator is made of two materials, borosilicate glass and silicon. The glass is the same material as the mounting surface of the microelectromechanical system (MEMS) sensors. The silicon makes an excellent isolator, being very elastic and easy to form into complex shapes. The two materials of the isolator are joined using an anodic bond. The construction of the isolator can be specific to different types of MEMS sensors, making the most of their geometry to reduce overall volume.

18 Claims, 5 Drawing Sheets

US 9,187,313 B2

ANODICALLY BONDED STRAIN ISOLATOR

BACKGROUND OF THE INVENTION

Inertial and pressure sensors can be very sensitive to stresses and strains, interpreting the stresses/strains as signals when, in fact, they are not. These errors are often seen over temperature because the strain state of the system, to which the sensors are mounted, changes with expansion and contraction, due to temperature change. Other sources of strain change are also significant enough to have a negative effect on sensors, such as creep under stress or pressure. Changes in output over temperature must be modeled and subtracted from a sensor's output where accuracy is required. Larger strains from a given temperature change are harder to model accurately and may require more computing power and higher-order models. Any relaxation (creep) of the materials due to these strains cannot be modeled and shows up as sensor error.

Mechanical isolators are often used between the sensor and the system to which the sensor is mounted to allow for the strains to be taken up by the isolator rather than passing them on to the sensor. The isolator does this by having a mechanically elastic section between the sensor mount and the system, like a set of springs that always comes back to the same state after being stretched. Isolation features are easy to form in certain materials, such as silicon, but sensors are often made of other materials and the bond between the sensor and isolator creates unwanted stresses.

SUMMARY OF THE INVENTION

The present invention provides a stress isolator that allows a sensor to be attached to materials of the same coefficient of thermal expansion and still provide the required elastic isolation between the sensor and the system to which it is mounted. It does this using microelectromechanical system (MEMS) processing methods and is particularly compatible with MEMS sensors. The isolator is made of two materials, borosilicate glass and silicon. The glass is the same material as the mounting surface of the MEMS sensors. The silicon makes an excellent isolator, being very elastic and easy to form into complex shapes. The two materials of the isolator are joined using an anodic bond. The construction of the isolator can be specific to different types of MEMS sensors, making the most of their geometry to reduce overall volume.

In one aspect of the invention, the isolator supports other electrical components necessary to the MEMS sensor, which reduces overall system volume and increases performance by making the electrical paths as short as possible.

BRIEF DESCRIPTION OF THE DRAWINGS

Preferred and alternative embodiments of the present invention are described in detail below with reference to the following drawings:

FIGS. 2-1 and 2-2 are perspective views of an exemplary glass layer for use in a MEMS package, such as is shown in FIG. 1;

FIGS. 3-1 and 3-2 are perspective views of an exemplary spring layer for use in a MEMS package, such as is shown in FIG. 1;

FIGS. 5-1 and 5-2 are perspective views of the combined components from FIGS. 2 through 4.

DETAILED DESCRIPTION OF THE INVENTION

Figure 1:
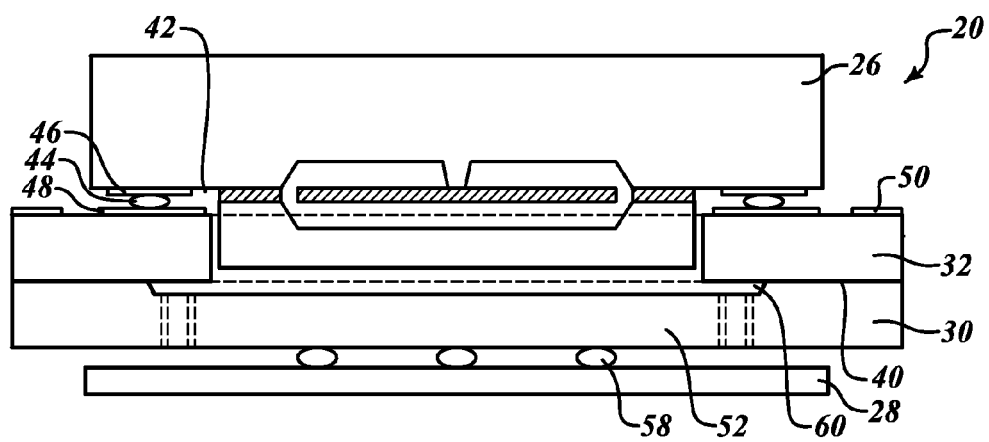
FIG. 1 is a side view of a MEMS package formed in accordance with an embodiment of the present invention.

FIG. 1 shows an exemplary microelectromechanical system (MEMS) package 20 that is mounted to a circuit board or housing 28. In one embodiment, the MEMS package 20 includes an isolater having a spring layer 30 made of silicon or similar material and a glass layer 32. A frame of the spring layer 30 is bonded (i.e., anodically) to the glass layer 32. Then, the glass layer 32 is bonded to a glass section of the MEMS die 26.

In one embodiment, the MEMS die 26 includes a flange (or cutout) 42 formed by the removal of portions of a cover and device layer. The flange 42 is made of glass similar to that of the glass layer 32. The flange 42 is attached to the glass layer 32 using metal pads 46, 48 (as necessary) and gold (or comparable metal) stud bumps 44. A hole that was previously etched or machined into the glass layer 32 allows reception of a portion of the MEMS die 26 that has been mounted in a flip-chip manner. A raft 52 of the silicon spring layer 30 is mounted to the housing 28 using gold (or comparable metal) stud bumps 58. A recess 60 is etched into the spring layer 30 prior to being bonded with the glass layer 32. Other suitable, electrically conductive attachment methods may be used for attaching the MEMS die 26 to the glass layer 32 or the spring layer 30 to the circuit board 28, such as solder, gold-silicon eutectic, or epoxy.

The isolator is a perfect or near-perfect coefficient of thermal expansion (CTE) match with the MEMS die 26. The spring layer 30 provides zero or near-zero outgassing and is easily formable into intricate shapes for the proper balance of support and flexibility required to absorb stress, using various photolithography techniques, various isotropic and nonisotropic etchants, and plasma-based techniques, such as deep reactive ion etching. The MEMS die 26 includes a section of borosilicate glass. The silicon is also a close CTE match to the MEMS die glass.

The following describes an exemplary construction process. First, metal patterns are applied to a first surface of a glass wafer, then hole(s) are drilled through the glass wafer. Next, a potassium hydroxide (KOH) etch is performed on a front side of a silicon wafer to create the recess 60. Then, a deep reactive ion etch (DRIE) is performed through the silicon wafer from a back side to create spring structures. Then, the glass wafer is anodically bonded to the silicon wafer. Next, the MEMS sensor is bonded to the isolator, then the isolator is attached to a MEMS package. In one embodiment, the MEMS sensors 26 is bonded to the isolator as a full wafer before dicing or one MEMS sensor at a time is bonded to one isolator after both the isolator wafer and MEMS wafer are diced.

The isolator allows for mounting of support electronics as close to the MEMS device as is possible. This allows for the least noise and smallest power consumption. By properly patterning metal on the glass layer 32, various kinds of surface-mount electrical devices, in die or packaged form, can be mounted.

Figures 1, 2:
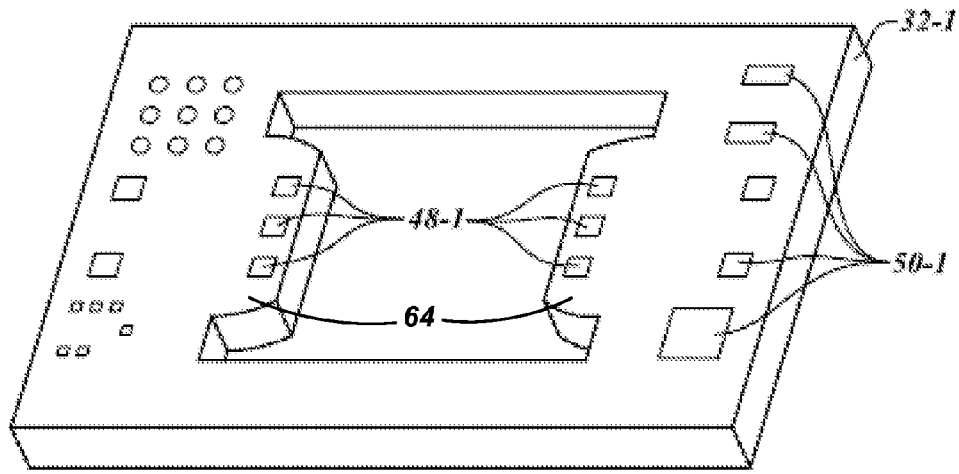
Figure 2:
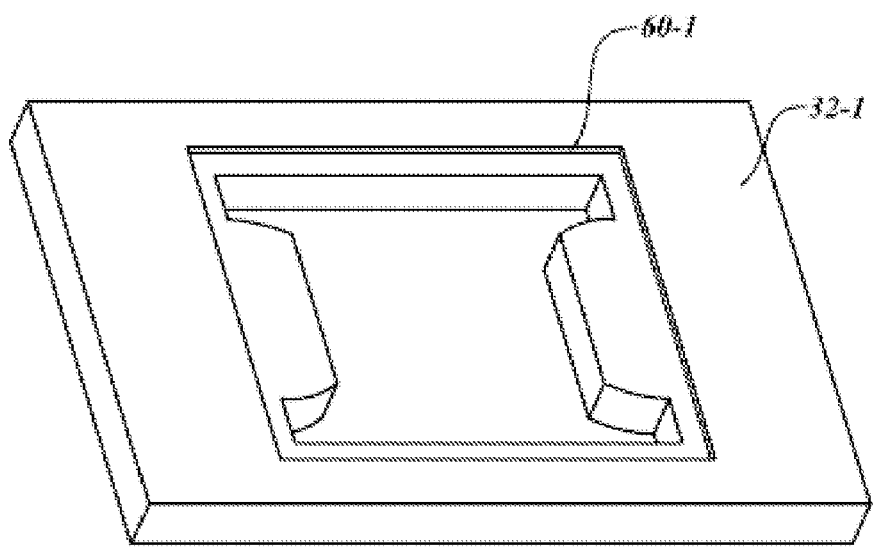

FIG. 2-1 shows a top perspective view of an exemplary isolator glass layer 32-1 that has been etched to provide a window that is framed on two opposing sides by flanges 64. Metallized pads 48-1 have been applied to a top surface of the flanges 64. Other pads 50-1 and traces (not shown) are simultaneously applied to the top surface of the isolator glass layer 32-1 for flip-chip mounting of a MEMS die. The interconnect traces are not shown, for clarity, and could connect in any required form. FIG. 2-2 shows a recess 60-1 located on a bottom of isolator glass layer 32-1. The recess 60-1 can be applied, instead of the recess 60, on the spring layer 30 of FIG. 1.

Figures 1, 3:
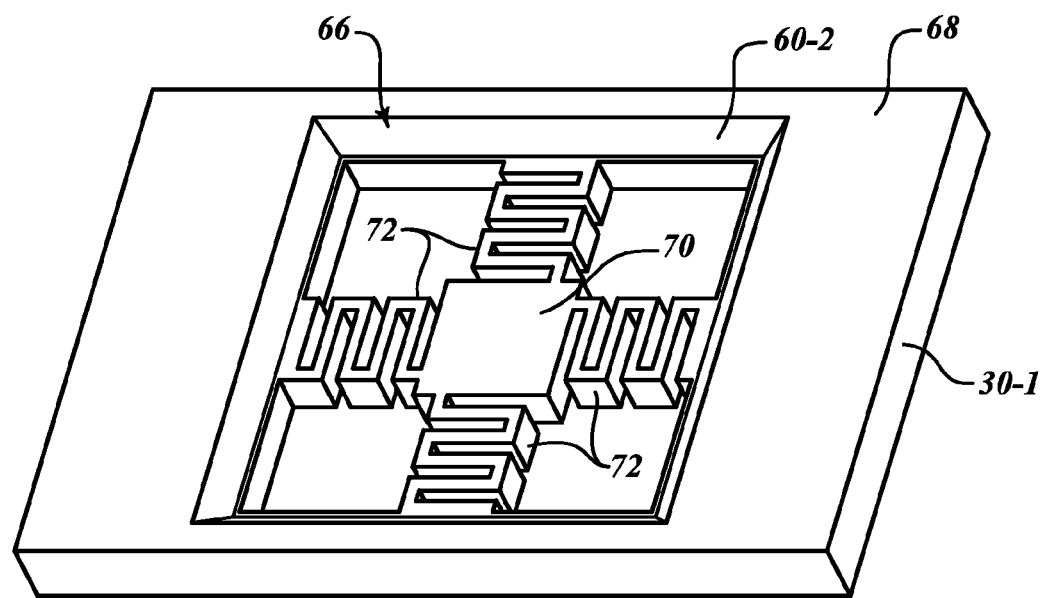
Figures 2, 3:
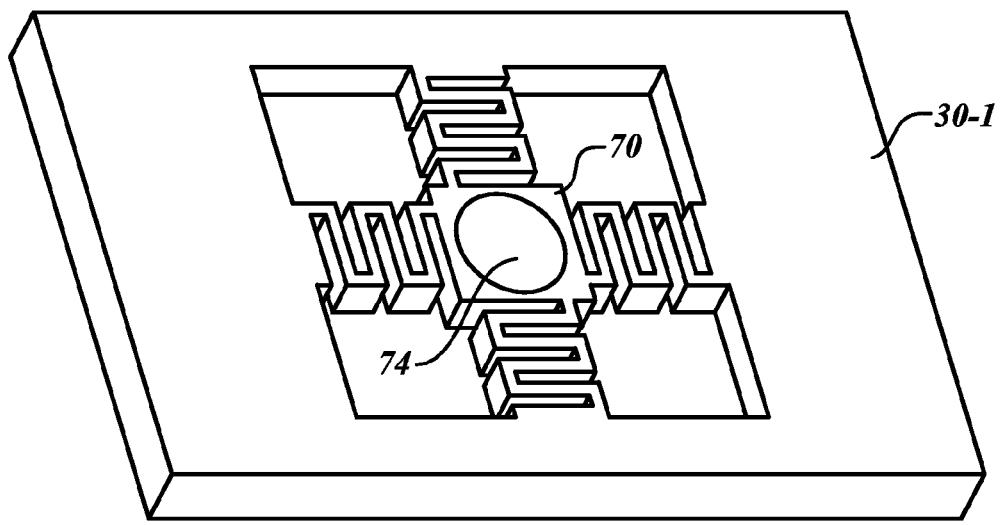

FIG. 3-1 shows a top perspective view of an exemplary spring layer 30-1. The spring layer 30-1 includes a frame 68 with a window 66. Etched into the window 66 are four S-shaped springs 72 and a raft 70. The springs 72 attach at one end to a different interior edge of the window 66 and at a second end to a different exterior edge of the raft 70. FIG. 3-2 shows an optional metal pad 74 that is attached to an underside of the raft 70. The metal pad 74 is later used to mount to a circuit board or housing via stud bumps (such as are shown in FIG. 1) or other suitable attachment methods such as solder, gold-silicon eutectic, or epoxy. A recess 60-2 is etched around the top edge of the window 66.

Figure 4:
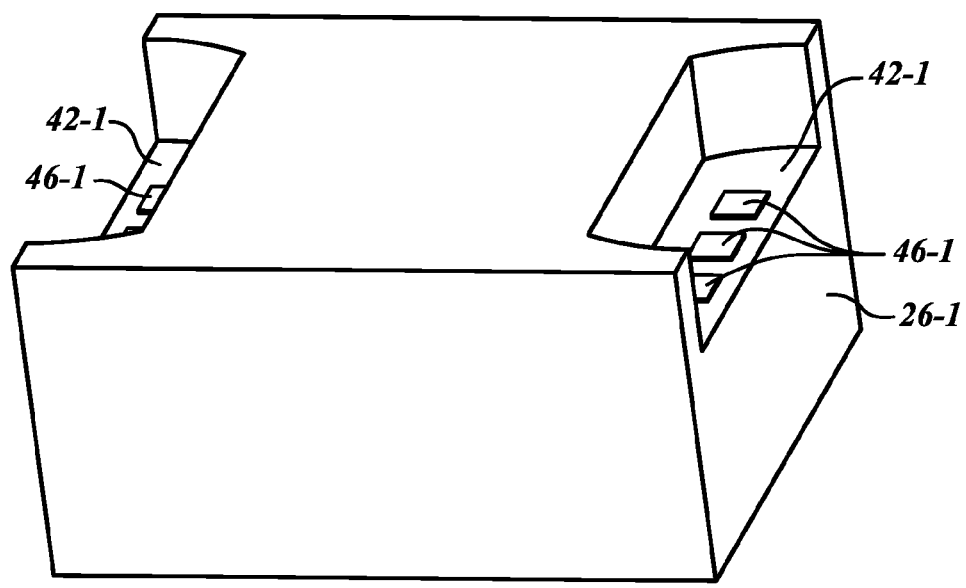
FIG. 4 is a perspective view of an exemplary MEMS component for mounting to the glass layer shown in FIGS. 2-1 and 2-2.

FIG. 4 shows a bottom perspective view of an exemplary MEMS die 26-1 configured to attach to the isolator glass layer 32-1 shown in FIGS. 2-1, 2-2. Flanges 42-1 have been formed from one end of the MEMS die 26-1, such that the flanges 42-1 reside near an intermediate section of the MEMS die 26-1. Metalized pads 46-1 are either applied to the flanges 42-1 or are previously applied to an intermediate/device layer of the MEMS die 26-1 and become exposed upon removal of material of the section adjacent the intermediate/device layer. The metallized pads 46-1 electrically connect to active components within the MEMS die 26-1.

Figures 1, 5:
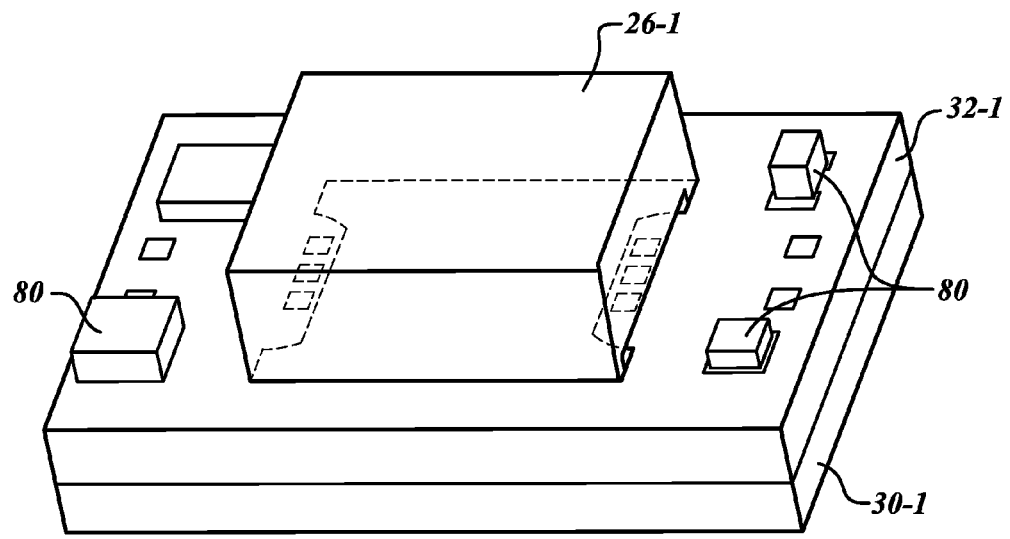
Figures 2, 5:
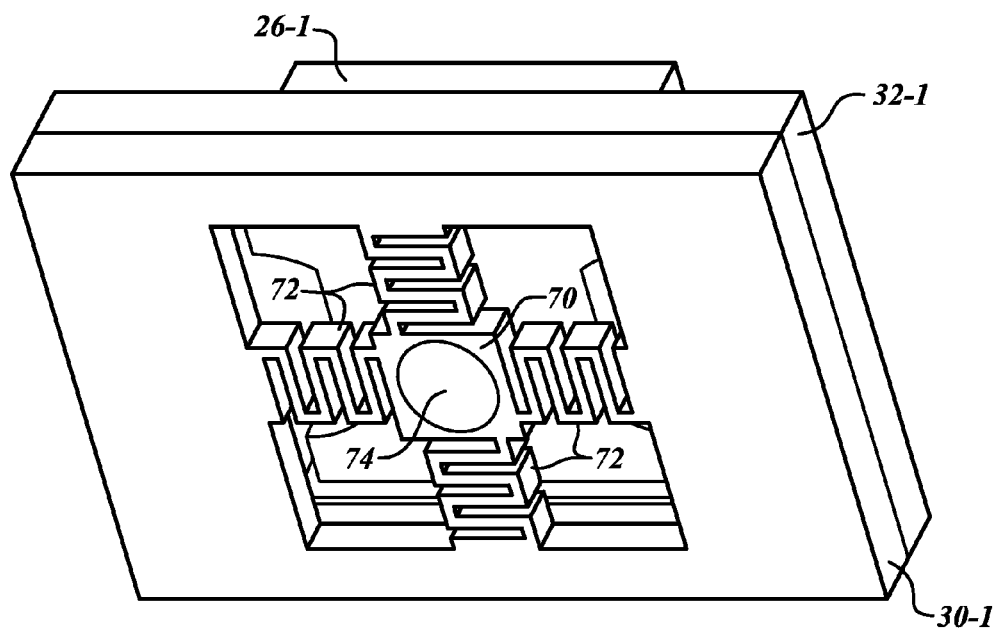

FIGS. 5-1 and 5-2 show the isolator glass layer 32-1 bonded to the spring layer 30-1 and the MEMS die 26-1 bonded to the isolator glass layer 32-1. The metalized pads 48-1 and 46-1 are bonded together, using stud bumps (not shown), in order to attach the MEMS die 26-1 to the isolator glass layer 32-1. Also, electrical components 80 are attached to the metallized pads 50-1. An example of the connection between the metalized pads 48-1, 46-1 and their respective surfaces are SiAu eutectic bonds.

In one embodiment, the MEMS die is mounted face up. Leads on the MEMS die are wirebonded to metal pads on the isolator or directly out to the circuit board/package. In another embodiment, the MEMS die has pads on its top surface and is flip-chip mounted to the glass on the isolator. A low-stress electrical connection from the isolator glass is then made, such as wirebonds.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. An isolation apparatus comprising:
    a first layer configured to bond to a mounting surface of a microelectromechanical system (MEMS) die, the first layer having a first coefficient of thermal expansion approximately equal to a second coefficient of thermal expansion of the mounting surface of the MEMS die; and
    a spring layer formed of a monolithic material, the spring layer comprising:
        a first section configured to bond to the first layer;
        a second section configured to bond to a circuit board; and
        one or more spring elements configured to flexibly attach the first section to the second section,
    wherein the spring layer comprises silicon and the first layer comprises glass, wherein a bond between the first layer and the spring layer comprises an anodic bond.

2. An assembly comprising:
    the isolation apparatus of claim 1; and the MEMS die, wherein the mounting surface of the MEMS die comprises glass.

3. The assembly of claim 2, further comprising:
    at least one metal pad bonded to the first layer;
    at least one metal pad bonded to the MEMS die; and
    at least one electrically conductive bonding material configured to provide a bond between the at least one first layer metal pad and the at least one MEMS die metal pad.

4. The apparatus of claim 3, wherein the at least one MEMS die metal pad is electrically coupled to internal components of the MEMS die.

5. The apparatus of claim 1, wherein the first layer comprises a cavity configured to allow the MEMS die to pass through when the MEMS die is mounted to the first layer.

6. The apparatus of claim 5, wherein the first layer comprises at least one flange configured to bond to only the MEMS die.

7. The apparatus of claim 5, wherein at least one of the first layer or the spring layer comprises a recess configured to provide separation of the at least one flange from the spring layer.

8. A method comprising:
    anodically bonding a first layer to a first section of a spring layer formed of a monolithic material, the spring layer comprising silicon and the first layer comprising glass;
    bonding the first layer to a mounting surface of a MEMS die, the first layer having a first coefficient of thermal expansion approximately equal to a second coefficient of thermal expansion of the mounting surface of the MEMS die; and
    bonding a second section of the spring layer to a circuit board, wherein the spring layer comprises one or more spring elements that flexibly attach the first section to the second section.

9. The method of claim 8, wherein the first layer and the mounting surface of the MEMS die comprise glass.

10. The method of claim 9, wherein bonding the first layer to the mounting surface of the MEMS die comprises:
    bonding at least one metal pad to the first layer;
    bonding at least one metal pad to the MEMS die; and
    bonding at least one electrically conductive bonding material between the at least one first layer metal pad and the at least one MEMS die metal pad.

11. The method of claim 10, wherein the at least one MEMS die metal pad is electrically coupled to internal components of the MEMS die.

12. The method of claim 8, further comprising etching a cavity into the first layer to allow the MEMS die to pass through when the MEMS die is mounted to the first layer.

13. The method of claim 12, further comprising etching a recess into at least one of the first layer or the spring layer to provide separation of the at least one flange from the spring layer.

14. A microelectromechanical system (MEMS) package comprising:
    a MEMS die comprising:
        a sensor; and
        a mounting surface; and
    an isolation apparatus comprising:
        a first layer configured to bond to the mounting surface of the MEMS die, the first layer having a first coefficient of thermal expansion approximately equal to a second coefficient of thermal expansion of the mounting surface of the MEMS die; and a spring layer formed of a monolithic material, the spring layer comprising:
  a first section configured to bond to the first layer;
  a second section configured to bond to a circuit board; and
  one or more spring elements configured to flexibly attach the first section to the second section,
wherein the spring layer comprises silicon and the first layer comprises glass, wherein a bond between the first layer and the spring layer comprises an anodic bond.

15. The package of claim 14, wherein the first layer and the mounting surface of the MEMS die comprise glass.

16. The package of claim 15, wherein the isolation apparatus further comprises:

at least one metal pad bonded to the first layer;
at least one metal pad bonded to the MEMS die; and
at least one electrically conductive bonding material bonded between the at least one first layer metal pad and the at least one MEMS die metal pad.

17. The package of claim 16, wherein the at least one MEMS die metal pad is electrically coupled to internal components of the MEMS die.

18. The package of claim 14, wherein the first layer comprises a cavity configured to allow the MEMS die to pass through when the MEMS die is mounted to the first layer, wherein the first layer comprises at least one flange configured to bond to only the MEMS die, wherein at least one of the first layer or the spring layer comprises a recess configured to provide separation of the at least one flange from the spring layer.

* * * * *